United States Patent
Nakanishi et al.

(10) Patent No.: US 9,787,319 B2
(45) Date of Patent: *Oct. 10, 2017

(54) SIGNAL MODULATION CIRCUIT

(71) Applicant: Onkyo Corporation, Osaka (JP)

(72) Inventors: Yoshinori Nakanishi, Osaka (JP);
Tsuyoshi Kawaguchi, Osaka (JP);
Mamoru Sekiya, Osaka (JP)

(73) Assignee: Onkyo Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/137,129

(22) Filed: Apr. 25, 2016

(65) Prior Publication Data

US 2016/0241256 A1    Aug. 18, 2016

Related U.S. Application Data

(62) Division of application No. 14/295,587, filed on Jun. 4, 2014, now Pat. No. 9,350,378.

(30) Foreign Application Priority Data

Jun. 11, 2013  (JP) .................................. 2013-123047
Jan. 22, 2014  (JP) .................................. 2014-009841

(51) Int. Cl.
*H03M 3/00* (2006.01)
*H04R 3/00* (2006.01)
(Continued)

(52) U.S. Cl.
CPC .......... *H03M 3/37* (2013.01); *G11B 20/10009* (2013.01); *H03M 3/30* (2013.01);
(Continued)

(58) Field of Classification Search
CPC .......... H03M 3/43; H03M 3/30; H03M 3/348; H03M 3/456; H03M 3/458; H03M 3/366; H03M 3/452
(Continued)

(56) References Cited

U.S. PATENT DOCUMENTS 4,972,436 A       11/1990  Halim et al.
5,245,343 A  *    9/1993   Greenwood ............ H03M 3/39
                                                    341/143
(Continued)

FOREIGN PATENT DOCUMENTS

GB     2 111 332 A    6/1983
JP     2002-543656    12/2002
(Continued)

OTHER PUBLICATIONS

Co-pending U.S. Appl. No. 14/295,587, filed Jun. 4, 2014.
(Continued)

*Primary Examiner* — Jean B Jeanglaude
(74) *Attorney, Agent, or Firm* — Renner Otto Boisselle & Sklar, LLP

(57) ABSTRACT

Provided is a modulation circuit that can correct an output state in real time and reliably modulate an input signal to output the modulated signal. The signal modulation circuit includes a subtractor, an integrator, a chopper circuit, a frequency divider, and a D-type flip-flop. A delay circuit of a sigma delta modulation circuit is not provided to a feedback circuit, and a signal is delayed and quantized in the D-type flip-flop. The chopper circuit inserts a zero level at timing synchronized with a clock signal, so that pulse density modulation is performed.

4 Claims, 18 Drawing Sheets

(51) Int. Cl.
*G11B 20/10* (2006.01)
*G11B 20/00* (2006.01)

(52) U.S. Cl.
CPC ............ *H03M 3/346* (2013.01); *H03M 3/348* (2013.01); *H03M 3/424* (2013.01); *H04R 3/00* (2013.01); *G11B 2020/00065* (2013.01)

(58) Field of Classification Search
USPC .................................................. 341/143, 155
See application file for complete search history.

(56) References Cited

U.S. PATENT DOCUMENTS

| | | | |
|---|---|---|---|
| 6,369,730 | B1 | 4/2002 | Blanken et al. |
| 6,998,910 | B2 * | 2/2006 | Hezar .................... H03F 3/217 330/10 |
| 8,106,809 | B2 | 1/2012 | Groenewold |
| 2003/0058146 | A1 | 3/2003 | Sunquist et al. |
| 2005/0162222 | A1 | 7/2005 | Hezar et al. |
| 2006/0023825 | A1 * | 2/2006 | Kato ................... G06F 13/4273 375/372 |
| 2006/0044057 | A1 | 3/2006 | Hezar et al. |
| 2006/0119389 | A1 | 6/2006 | Kaneda |
| 2008/0008067 | A1 | 1/2008 | Arisaka |
| 2008/0042746 | A1 | 2/2008 | Kozak et al. |
| 2008/0258956 | A1 | 10/2008 | Konrad et al. |
| 2008/0309536 | A1 | 12/2008 | Le Guillou |
| 2013/0057421 | A1 | 3/2013 | Aruga et al. |

FOREIGN PATENT DOCUMENTS

| | | |
|---|---|---|
| JP | 2007-312258 A | 11/2007 |
| JP | 2012-527187 A | 11/2012 |
| JP | 2013-055450 | 3/2013 |

OTHER PUBLICATIONS

European Search Report for corresponding European Patent Application No. 14170009.6-1805 dated Nov. 10, 2014.
Summons to attend oral proceedings for corresponding European Patent Application No. 14170009.6 dated Jul. 18, 2016.

* cited by examiner

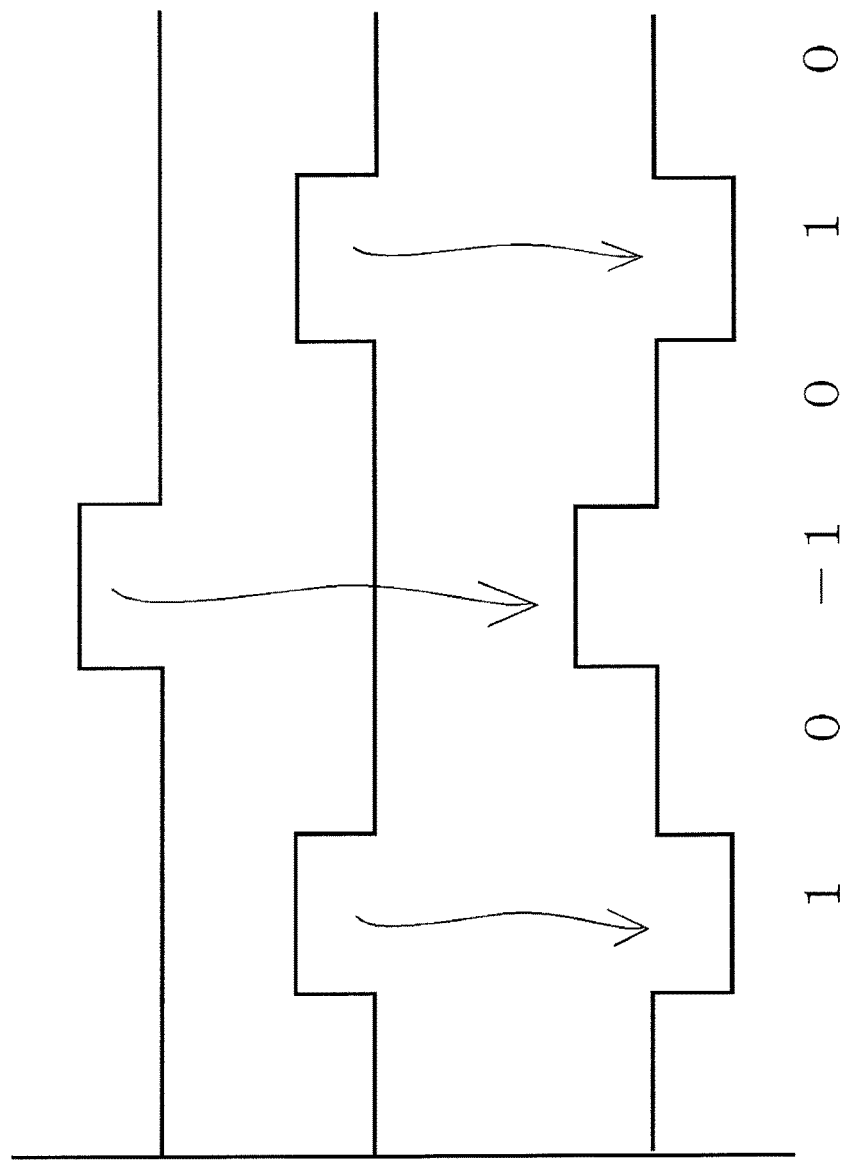

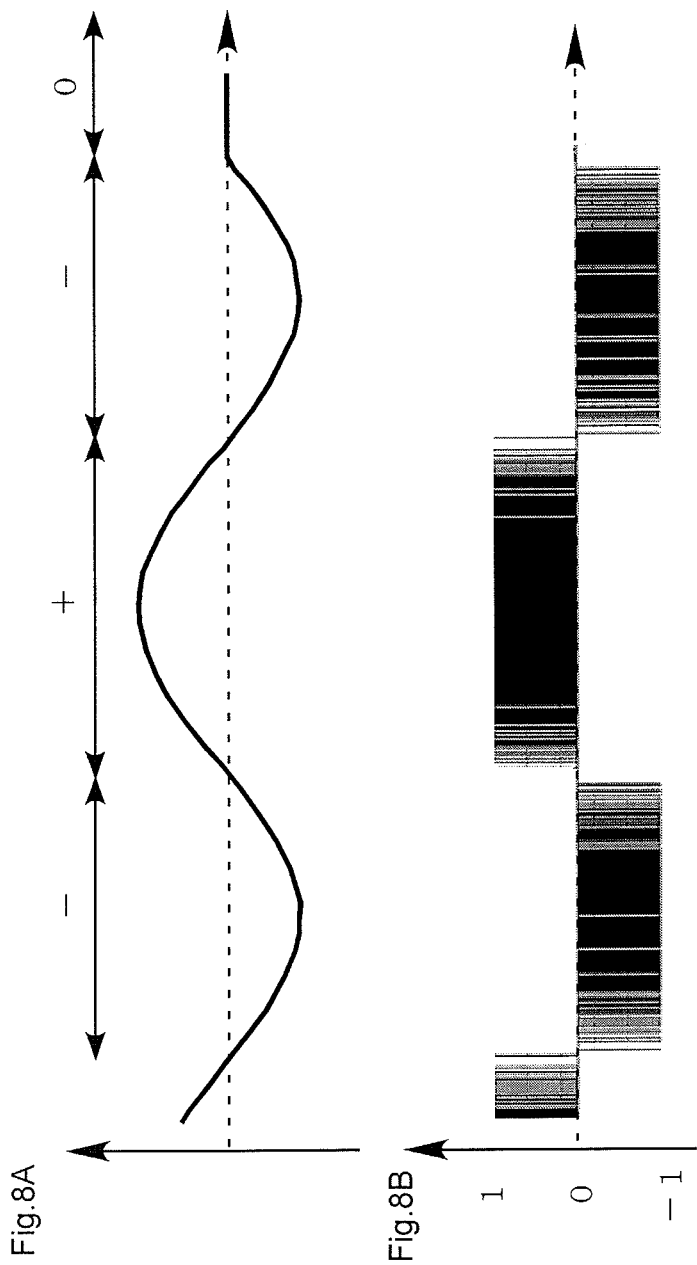

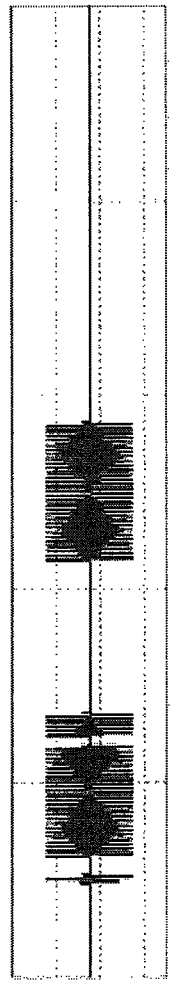
Fig.12A Sig1
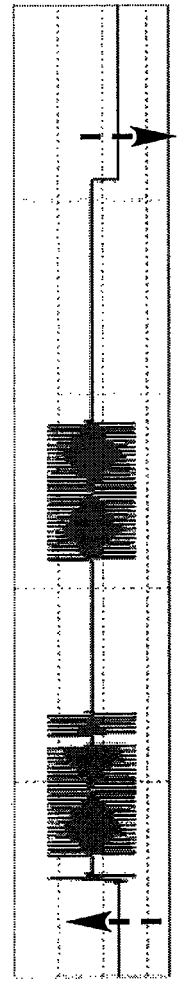
Fig.12B Sig2
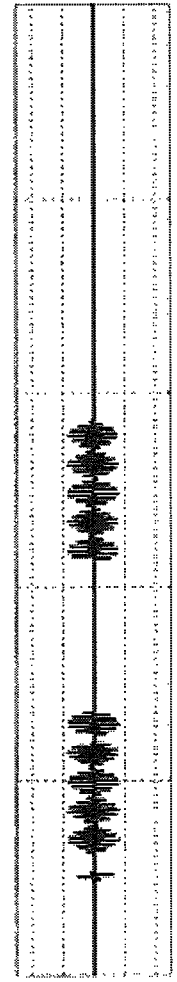
Fig.12C Input
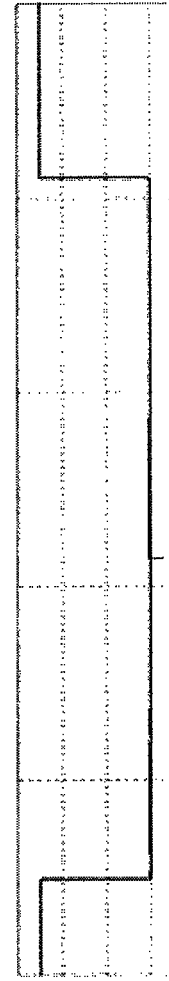
Fig.12D CNT

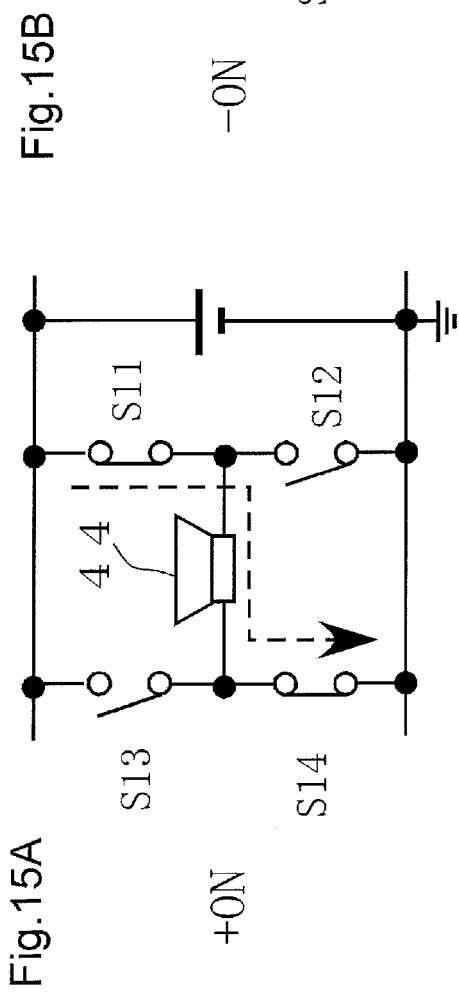
Fig.15A +ON
Fig.15B −ON
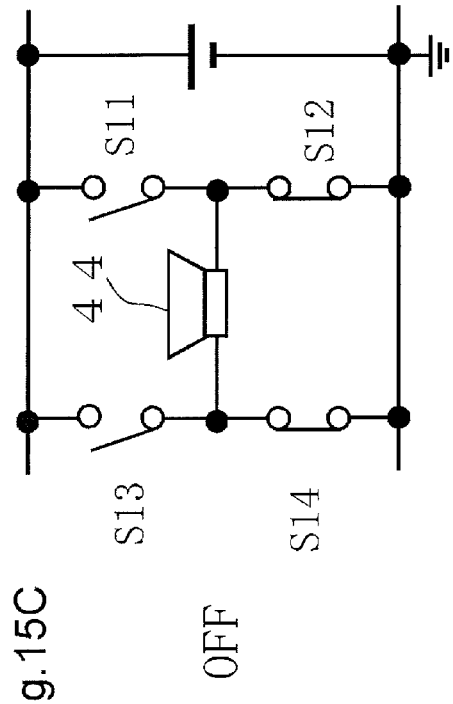
Fig.15C OFF
Fig.15D OFF

SIGNAL MODULATION CIRCUIT

BACKGROUND OF THE INVENTION

1. Field of the Invention

The present invention relates to a signal modulation circuit, and particularly relates to a circuit for performing delta sigma modulation.

2. Description of the Related Art

Conventionally, delta sigma modulation (ΔΣ modulation) is used in switching amplifiers or the like. A delta sigma modulator has a subtractor, an integrator, a quantizer, and a quantization error feedback circuit.

FIG. 17 illustrates a basic configuration of a delta sigma modulation circuit. A subtractor 16 calculates a difference between an input signal and a feedback signal, and an integrator 10 integrates the difference signal. An integral signal is quantized by a quantizer 14 and is output as, for example, 1 bit (=binary) signal. The quantization error is fed back via a delay device 12.

JP 2007-312258 A discloses a delta sigma modulation circuit including an integrator group, an adder group, a quantizer, and a pulse width round-up circuit, and further discloses that a signal is converted into a one-bit signal synchronized with a sampling clock so as to be output. In addition, JP 2007-312258 A discloses that a D-type flip-flop is used as the quantizer. JP 2012-527187 W also discloses a delta sigma modulation circuit.

In the configuration shown in FIG. 17, the delay device 12 is provided to a feedback path so that noise shaping is performed. At the same time, however, the configuration has a problem that the delay device 12 in the feedback path cannot correct an output state in real time, or a problem that noise shaping is not performed on distortion/noise components generated in the delay device and the distortion/noise components are directly output.

Further, when the delta sigma modulation circuit is used in a one-bit audio amplifier, pulse width modulation (PWM) and pulse density modulation (PDM) are used as a system for modulating an input signal into a one-bit digital signal. When PDM is used, which is suitable for a case where an input signal is expressed by density or frequency of a pulse, a zero level is inserted at predetermined timing so that a pulse width is maintained, and a level of the input signal needs to be reliably modulated into the frequency of the pulse.

SUMMARY OF THE INVENTION

It is an object of the present invention to provide a circuit that can correct an output state in real time, can reduce an influence of distortion/noise components in a delay device, and can reliably modulate an input signal so as to output the modulated signal.

The present invention provides a signal modulation circuit for performing delta sigma modulation on an input signal in synchronization with a clock signal to output the modulated signal, the circuit including a subtractor for calculating a difference between the input signal and a feedback signal, an integrator for integrating an output signal from the subtractor, a zero level inserting circuit for inserting a zero level into the signal integrated by the integrator at timing synchronized with the clock signal, a quantizer for delaying the signal output from the zero level inserting circuit and quantizing the delayed signal, and a feedback circuit for negatively feeding back the signal quantized by the quantizer to the input signal.

In the present invention, unlike the conventional delta sigma modulation circuit, a delay circuit is not provided to a feedback circuit for negatively feeding back an output signal of the quantizer, but a delay function is provided between the integrator and the quantizer. Thus, the output state can be corrected in real time. A zero level (zero voltage) is inserted into a signal integrated by the integrator at timing synchronized with a clock signal, so that pulse density modulation (PDM) can be reliably performed on an input signal.

Further, the present invention provides a signal modulation circuit for performing delta sigma modulation on an input signal in synchronization with a clock signal to output the modulated signal, the circuit including a subtractor for calculating a difference between the input signal and a feedback signal, an integrator for integrating an output signal from the subtractor, a phase inverting circuit for inverting a phase of the signal integrated by the integrator, a first bias voltage applying circuit for applying a bias voltage to the signal integrated by the integrator, a second bias voltage applying circuit for applying a bias voltage to the signal whose phase is inverted by the phase inverting circuit, a first zero level inserting circuit for inserting a zero level into the signal output from the first bias voltage applying circuit at timing synchronized with the clock signal, a second zero level inserting circuit for inserting a zero level into the signal output from the second bias voltage applying circuit at timing synchronized with the clock signal, a first quantizer for delaying the signal output from the first zero level inserting circuit and quantizing the delayed signal, a second quantizer for delaying the signal output from the second zero level inserting circuit and quantizing the delayed signal, a pulse synthesizing circuit for synthesizing the signal output from the first quantizer with the signal output from the second quantizer, and a feedback circuit for negatively feeding back the signal synthesized by the pulse synthesizing circuit to the input signal.

In the present invention, the integrator, the first bias voltage applying circuit, a first zero level inserting circuit, and the first quantizer configure one processing system so as to generate a binary signal of +1 and 0. The integrator, the phase inverting circuit, the second bias voltage applying circuit, the second zero level inserting circuit, and the second quantizer configure another processing system so as to generate a binary signal of −1 and 0. The pulse synthesizing circuit synthesizes these signals so as to generate a ternary signal of +1, 0, and −1. The subtractor is used when a signal to be fed back has a positive phase with respect to an input signal. An adder can be used in place of the subtractor when a signal to be fed back has a phase opposite to that of an input signal.

In the present invention, the signal modulation circuit further includes a signal detector for detecting an input signal, wherein the first bias voltage applying circuit and the second bias voltage applying circuit apply the bias voltages that are comparatively small when the signal detector detects the input signal, and apply the bias voltages that are comparatively large when the signal detector does not detect the input signal.

In another embodiment of the present invention, a generating circuit for generating a signal for selectively driving a loudspeaker connected to a single power supply into a ternary conductive state including a positive current on-state, a negative current on-state, and an off-state.

Instill another embodiment of the present invention, one end of the loudspeaker is connected to a connection node between a first switch and a second switch connected to each other in series, and the other end is connected to a connection node between a third switch and a fourth switch connected to each other in series, the first switch and the third switch being connected to a positive pole side of the single power supply, and the second switch and the fourth switch being connected to a negative pole side of the single power supply, and the generating circuit generates a switching signal for turning on the first switch and turning off the second switch, and a switching signal for turning off the third switch and turning on the fourth switch, based on the signal output from the first quantizer and the signal output from the second quantizer to drive the loudspeaker in the positive current on-state, generates a switching signal for turning off the first switch and turning on the second switch, and a switching signal for turning on the third switch and turning off the fourth switch to drive the loudspeaker in the negative current on-state, and generates a switching signal for turning off the first switch and the third switch and turning on the second switch and the fourth switch, or generates a switching signal for turning off the second switch and the fourth switch and turning on the first switch and the third switch to turn off the loudspeaker.

According to yet another embodiment of the present invention, the zero level inserting circuit includes a frequency divider for dividing a frequency of the clock signal, and a chopper circuit that operates according to the clock signal whose frequency is divided by the frequency divider.

According to yet another embodiment of the present invention, the quantizer is configured by a D-type flip-flop.

According to the present invention, an output state can be corrected in real time, and an influence of distortion/noise components in the delay device can be reduced, and an input signal can be reliably modulated so as to be output. In addition, according to the present invention, a ternary signal of +1, 0, and −1 can be generated. Further, according to the present invention, the loudspeaker connected to the single power supply can be driven in a ternary state.

BRIEF DESCRIPTION OF THE DRAWINGS

FIGS. 7A to 7C are timing charts according to the second embodiment;

FIGS. 8A and 8B are explanatory diagrams illustrating waveforms according to the second embodiment;

FIGS. 12A to 12D are timing charts according to the third embodiment;

FIGS. 15A to 15D are explanatory diagrams each illustrating a loudspeaker driving state according to the fourth embodiment;

DETAILED DESCRIPTION OF THE PREFERRED EMBODIMENTS

Embodiments of the present invention will be described below with reference to the drawings.

First Embodiment

Figure 1:
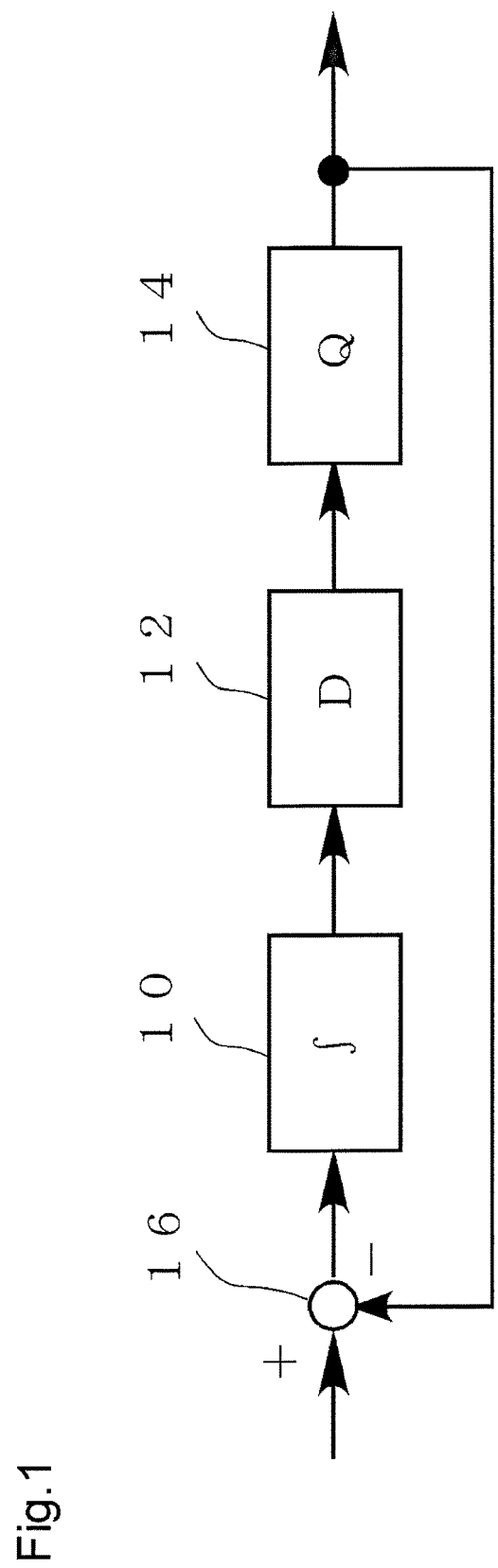
FIG. 1 is a configuration block diagram according to a first embodiment.

FIG. 1 illustrates a basic configuration of a signal modulation circuit according to the first embodiment. The signal modulation circuit according to this embodiment performs delta sigma modulation on an input signal, and includes a subtractor 16, an integrator 10, a delay device 12, and a quantizer 14.

Figure 17:
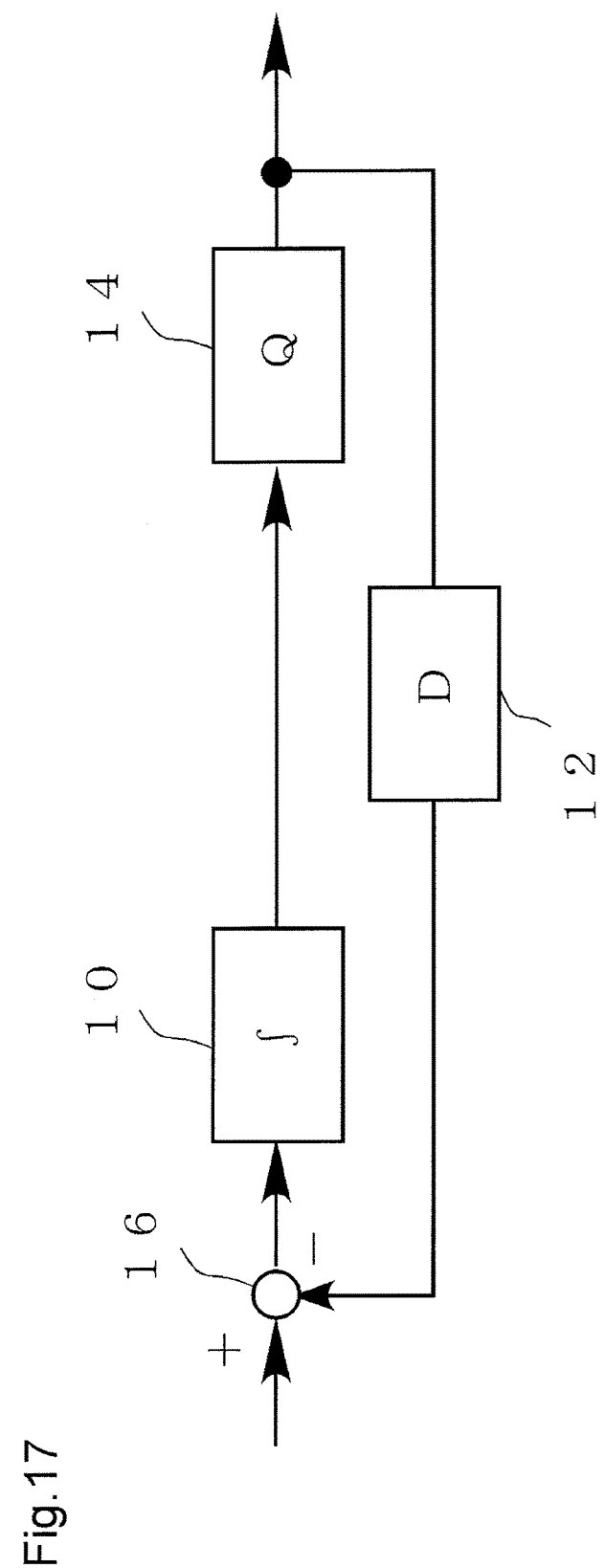
FIG. 17 is a configuration block diagram of a conventional technique.

The circuit shown in FIG. 1 is compared with a circuit shown in FIG. 17. In the circuit according to this embodiment, the delay device 12 is not present on a feedback path, but is provided at a front stage of the quantizer 14, that is, between the integrator 10 and the quantizer 14. Therefore, in the circuit according to this embodiment, an output state can be corrected in real time.

The delay device 12 according to this embodiment has a function for not only delaying an input signal but also inserting a zero level into an input signal, and this realizes more reliable pulse density modulation. Any circuit for inserting the zero level into an input signal is used, but it can be configured by, for example, a chopper circuit whose one end is grounded. Further, a delay function and a quantizing function can be configured by a D-type flip-flop. Further, the subtractor 16 is used for a case where a signal to be fed back is has a positive phase with respect to the input signal. An adder can be used in place of the subtractor 16 in a case where a signal to be fed back has a phase opposite to that of the input signal.

Figure 2:
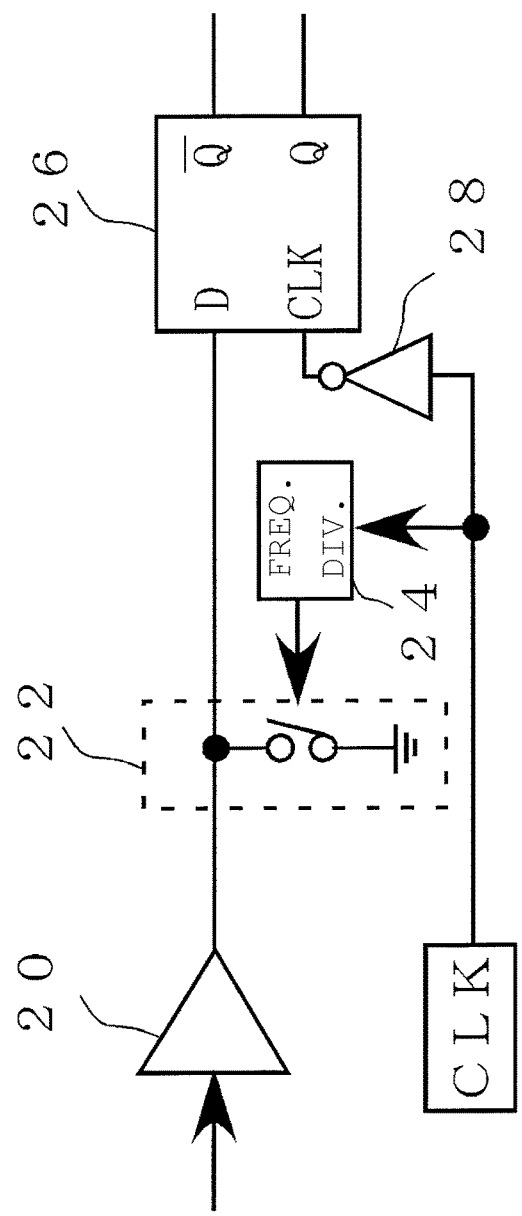
FIG. 2 is a circuit configuration diagram according to the first embodiment.

FIG. 2 illustrates a specific circuit configuration according to this embodiment. The circuit includes an amplifier 20 constituting the integrator, a chopper circuit 22, a ½ frequency divider 24, a D-type flip-flop 26, and an inverter 28.

The chopper circuit 22 is configured by a switch whose one end is connected to an output end of the amplifier 20 and other end is grounded. Switching of the switch is controlled by an output signal from the ½ frequency divider 24. An output signal from the chopper circuit 22 is supplied to a D terminal of the D-type flip-flop 26.

The ½ frequency divider 24 is a circuit for receiving a clock signal and dividing a frequency of the clock signal to ½. The ½ frequency divider 24 divides the frequency of the clock signal and controls the switch of the chopper circuit 22. Therefore, the switch of the chopper circuit 22 is turned on/off in a cycle that is twice as long as the clock signal. At the timing when the switch is turned on, the output end of the amplifier 20 is at a zero level because it is grounded via the switch. Therefore, the chopper circuit 22 functions as a circuit for inserting the zero level into the input signal of the D-type flip-flop 26.

A signal, which is the output signal from the amplifier 20 and into which the zero level is inserted in synchronization with the clock signal in the chopper circuit 22 as described above, is supplied to the D terminal of the D-type flip-flop 26. Further, a clock signal that is inverted by the inverter 28 is supplied to a clock terminal of the D-type flip-flop 26. The D-type flip-flop 26 outputs a signal at a rising edge of the input clock signal. Therefore, in this embodiment, the signal is output at a rising edge of the inverted clock signal.

Figure 3:
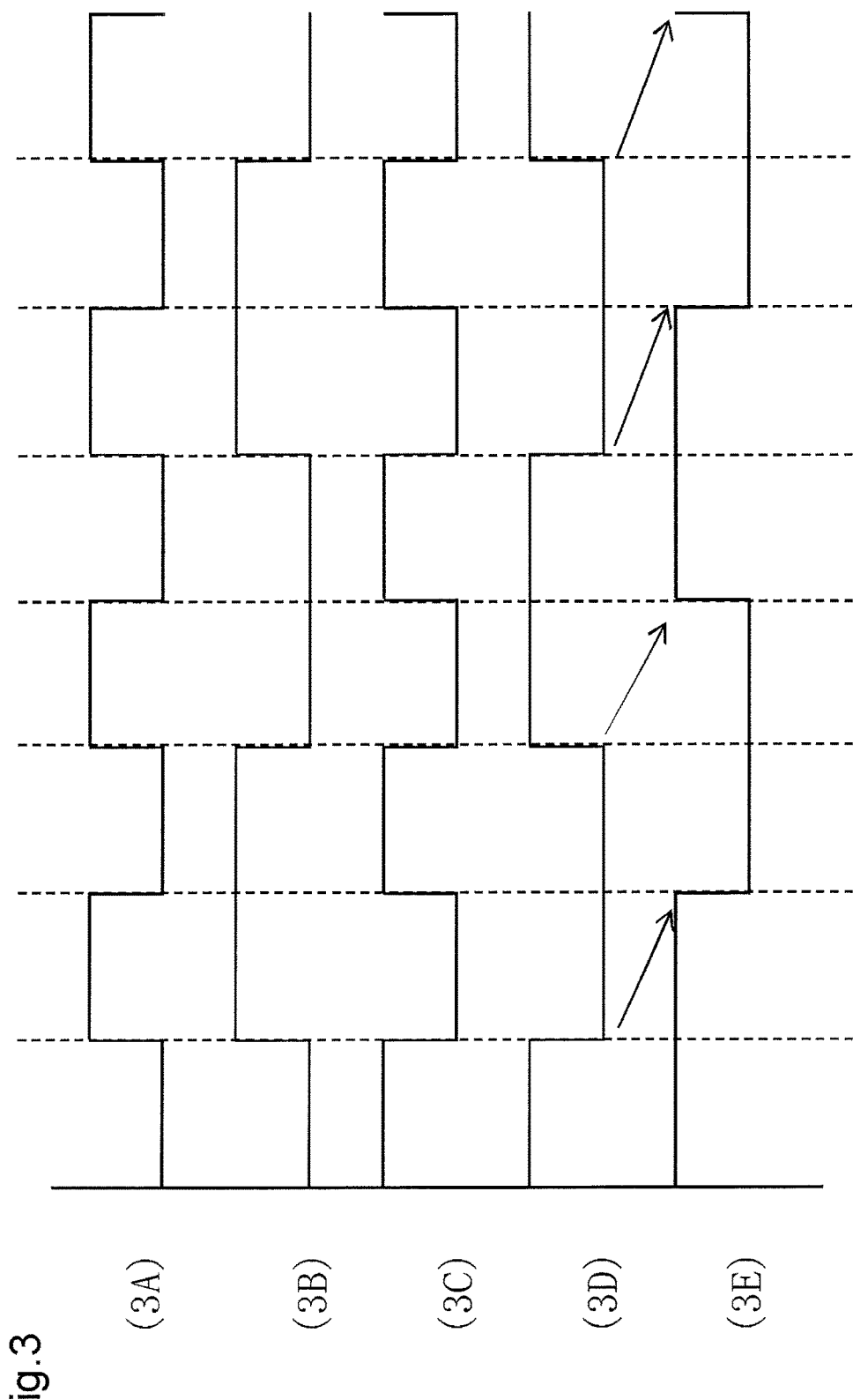
FIG. 3 is a timing chart according to the first embodiment.

FIG. 3 is a timing chart of the circuit in FIG. 2. FIG. 3 is a timing chart for a case where a positive signal is input. FIG. 3 illustrates, from the top, waveforms of (3A) a clock signal (CLK), (3B) a ½ frequency divided signal of the clock signal, (3C) an inverted signal of the clock signal, (3D) a signal to be supplied to the D terminal of the D-type flip-flop 26, and (3E) a signal to be output from a Q output terminal of the D-type flip-flop 26.

Since the chopper circuit 22 is switched on at the timing of the ½ frequency divided signal of the clock signal, a signal to be supplied to the D terminal of the D-type flip-flop 26 is synchronized with the ½ frequency divided signal of the clock signal so as to be at the zero level. This signal is synchronized with the inverted signal of the clock signal and is delayed to the timing of the rising edge of the inverted signal of the clock signal so as to be output. In the above manner, the circuit in FIG. 2 performs integration, insertion of the zero level, delay, and quantization on an input signal. That is, the chopper circuit 22 and the D-type flip-flop 26 realize the zero level, the delay, and the quantization so that noise shape is realized without inserting the delay device into the feedback path. Further, the chopper circuit 22 always outputs the zero level once at the timing of the clock signal.

Figure 4:
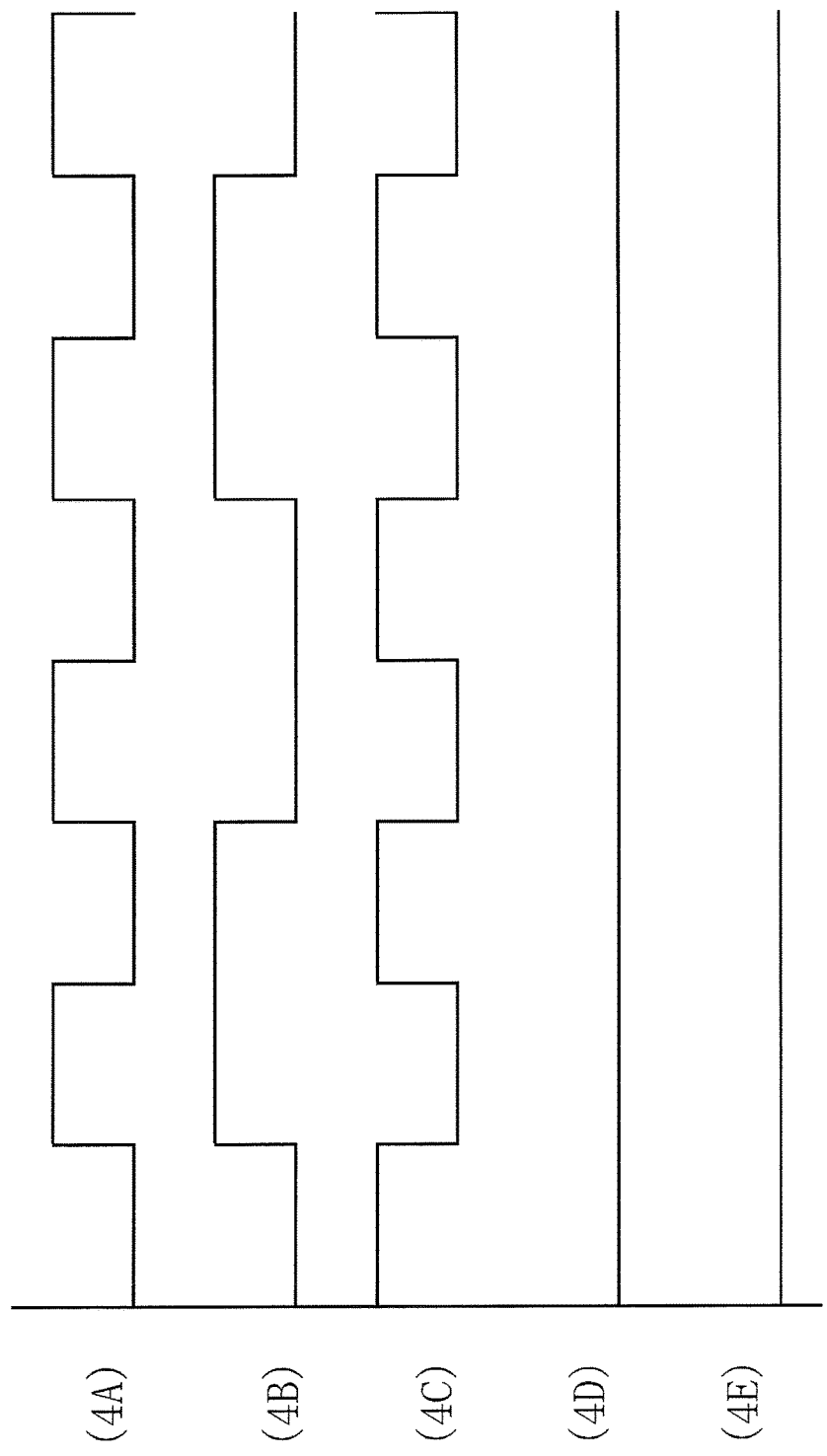
FIG. 4 is a timing chart according to the first embodiment.

FIG. 4 is an another timing chart illustrating the circuit in FIG. 2. FIG. 4 is the timing chart in a case where a negative signal is input. FIG. 4 illustrates, from the top, waveforms of (4A) a clock signal (CLK), (4B) a ½ frequency divided signal of the clock signal, (4C) an inverted signal of the clock signal, (4D) a signal to be supplied to the D terminal of the D-type flip-flop 26, and (4E) a signal to be output from a Q output terminal of the D-type flip-flop 26. A signal to be supplied to the D terminal of the D-type flip-flop 26 remains at the zero level, and the output signal also remains at the zero level.

In this embodiment, since the chopper circuit 22 inserts the zero level, 1 is not sequentially output as a signal to be output from the amplifier 20 constituting the integrator and supplied to the D-type flip-flop 26. Thus, distortion of a signal in a case of a three-state signal output is suppressed.

FIGS. 5A to 5F are diagrams schematically illustrating distortions that are generated in various signal levels in a case where signal widths continue as in a conventional technique and a case where the signal widths are made constant by inserting the zero level as in this embodiment.

Figure 5:
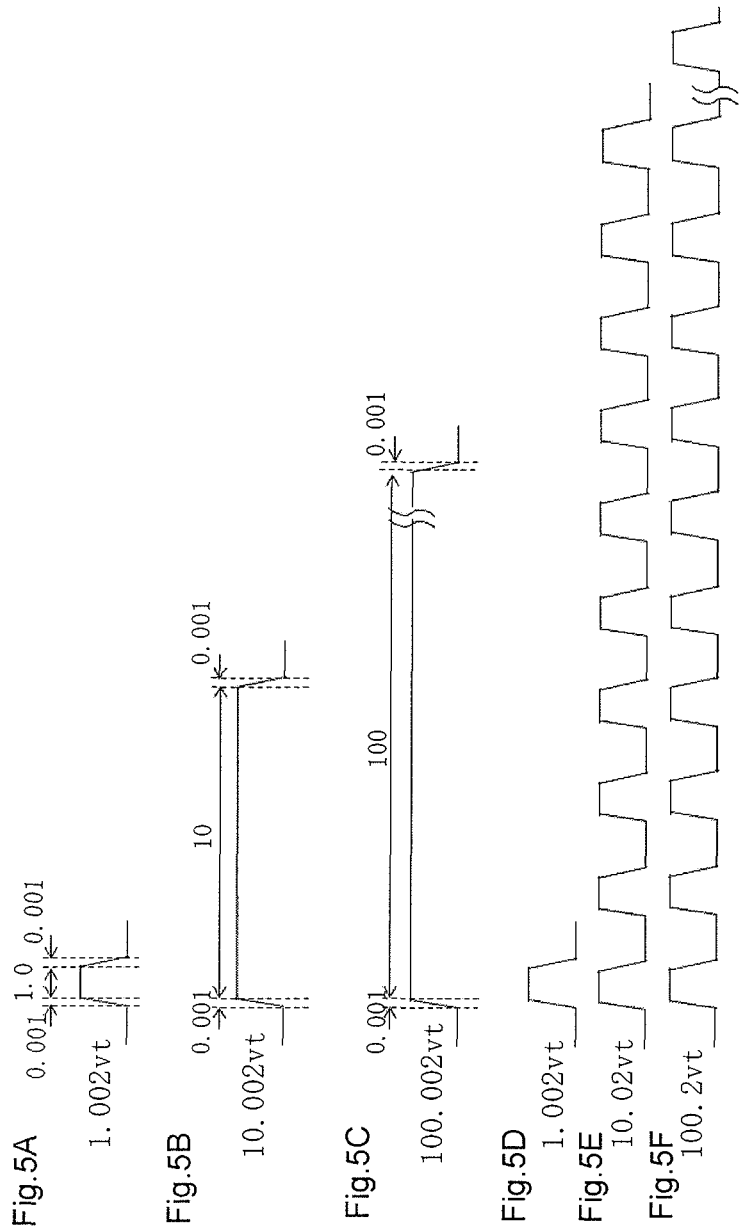
FIGS. 5A to 5F are diagrams schematically illustrating distortions generated in a conventional case and in the first embodiment.

The integration in the amplifier 20 constituting the integrator is multiplication of an input signal V and time t, and an area V·t decides signal quality. When the area other than the edge at time of the signal level 1 is denoted by Vt and the area of the edge portion is denoted by Vt/1000 in the case of the connected signal, integrated values are, as shown in FIGS. 5A, 5B, and 5C, the signal level 1: Vt+0.002 Vt=1.002 Vt,
the signal level 10: 10 Vt+0.002 Vt=10.002 Vt, and
the signal level 100: 100 Vt+0.002 Vt=100.002 Vt.

On the other hand, when the signal widths are constant as in this embodiment, the integrated value is, as shown in FIGS. 5D, 5E, and 5F, the signal level 1: Vt+0.002 Vt=1.002 Vt
the signal level 10: (Vt+0.002 Vt)×10=10.02 Vt, and
the signal level 100: (Vt+0.002 Vt)×100=100.20 Vt.

When the signal is connected in such a manner, a ratio of the edge area to the signal level fluctuates to a non-linear shape, but when an amplitude is constant, the ratio of the edge area to the signal level does not fluctuate, and thus linearity is maintained.

Second Embodiment

The spread of portable devices and the demand for energy saving in recent years require further promotion of efficiency of class-D amplifiers. Since general class-D amplifiers express a level using an average value of two signals of a positive voltage and a negative voltage, as to a non-signal state that is a zero voltage, a positive voltage and a negative voltage are expressed by a duty of 50%. That is, in the class-D amplifiers realized by binary signals, switching cross occurs also at the non-signal time, and thus the improvement in the switching cross is demanded. However, it is difficult for a binary signal to generate a state where switching is not performed at the non-signal state.

The second embodiment, therefore, describes a configuration in which, while the configuration in the first embodiment is being used, a ternary PDM signal of +1, 0, and −1 are generated so that the state where the switching is not performed at the non-signal time is generated.

Figure 6:
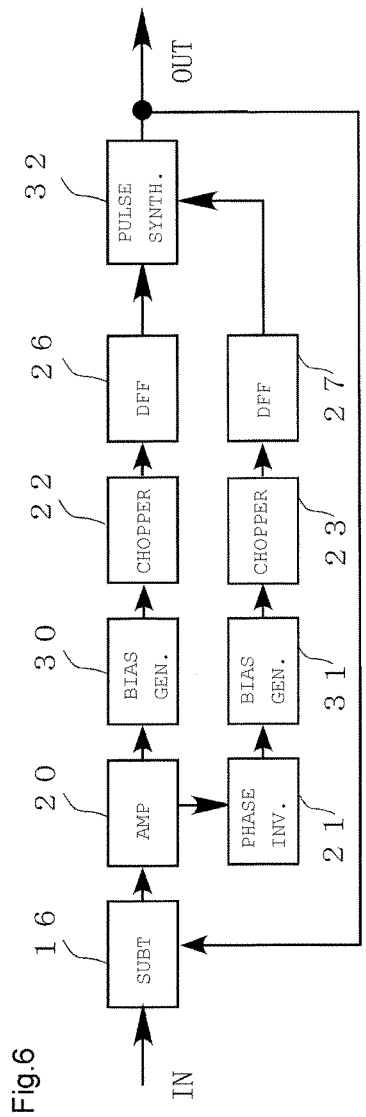
FIG. 6 is a configuration block diagram according to a second embodiment.

FIG. 6 illustrates a circuit configuration according to this embodiment. The circuit according to this embodiment includes a subtractor 16, an integrator 20, a bias generating circuit 30, a chopper circuit 22, and a D-type flip-flop (DFF) 26, and further includes a phase inverting circuit 21, a bias generating circuit 31, a chopper circuit 23, a D-type flip-flop (DFF) 27, and a pulse synthesizing circuit 32.

The subtractor 16, the integrator 20, the chopper circuit 22, and the D-type flip-flop 26 have the same configuration as that in the first embodiment. The integrator 20 performs integration, the chopper circuit 22 inserts a zero level (zero voltage) in synchronization with a clock signal, performs delay and quantization so as to generate and output a one-bit digital signal.

The bias generating circuit 30 is provided between the integrator 20 and the chopper circuit 22, and adjusts to increase the level of the signal output from the integrator 20.

The phase inverting circuit 21 is a circuit for inverting a phase of the signal output from the integrator 20, and outputs an inverted signal to the bias generating circuit 31.

The bias generating circuit 31 adjusts to increase the level of the inverted signal similarly to the bias generating circuit 30 so as to output the signal to the chopper circuit 23. A bias amount in the bias generating circuit 31 is equal to a bias amount in the bias generating circuit 30.

The chopper circuit 23 and the D-type flip-flop 27 insert a zero level (zero voltage) in synchronization with the clock of the input signal similarly to the chopper circuit 22 and the D-type flip-flop 26, and performs delay so as to generate and output a one-bit digital signal.

The pulse synthesizing circuit 32 synthesizes the one-bit digital signal from the D-type flip-flop 26 with a one-bit digital signal from the D-type flip-flop 27 so as to output the synthesized signal. Since the D-type flip-flop 26 converts the input signal into the one-bit digital signal so as to output the converted signal, this signal is a binary signal of +1 and 0. On the other hand, since the D-type flip-flop 27 converts the inverted signal obtained by inverting the input signal through the phase inverting circuit 21 into a one-bit digital signal so as to output the signal, this signal is a binary signal of −1 and 0. The pulse synthesizing circuit 32 synthesizes these two binary signals, and generates a ternary PDM signal of +1, 0, and −1 so as to output the signal. An output signal from the pulse synthesizing circuit 32 is fed back to the subtractor 16.

FIGS. 7A to 7C illustrate the pulse synthesis in the pulse synthesizing circuit 32. FIG. 7A illustrates an output signal waveform of the D-type flip-flop 26, and FIG. 7B illustrates an output signal waveform of the D-type flip-flop 27. FIG. 7C illustrates an output signal waveform obtained by synthesis in the pulse synthesizing circuit 32. Two one-bit digital signals are synthesized so that a ternary signal of +1, 0, and −1 is output. Any circuit configuration that can synthesize two one-bit digital signals can be used as the pulse synthesizing circuit 32. As one example, the circuit may be configured so as to include a switch group that has a first electric potential, a second electric potential, and a third electric potential that is a middle point between the first and second electric potentials and is a reference voltage, and whose outputs are fixed to the first electric potential, the second electric potential, and the third electric potential, and on/off of the switch group is controlled by the output signal from the D-type flip-flop 26 and the output signal from the D-type flip-flop 27 so as to selectively output any of the first electric potential, the second electric potential, and the third electric potential.

FIGS. 8A and 8B illustrate an input signal waveform, and an output signal waveform from the pulse synthesizing circuit 32. FIG. 8A illustrates the input signal waveform, and FIG. 8B illustrates an output signal waveform. When the signals of + signal waveform and − signal waveform are generated, the signals are converted into pulses of +1 and −1, and their levels are expressed by pulse density. At the non-signal time, as shown in FIG. 8B, neither a pulse of +1 nor a pulse of −1 is generated, and the switching is not performed. When the bias generating circuit 30 and the bias generating circuit 31 are not provided, the switching is occasionally performed because the level of the non-signal state is not necessarily the zero level (zero voltage). However, the bias generating circuit 30 and the bias generating circuit 31 apply a bias voltage and adjust the level of the non-signal state to the zero level, so that a state where the switching is not performed as the zero level (zero voltage) can be realized reliably at the non-signal state.

Figure 9A:
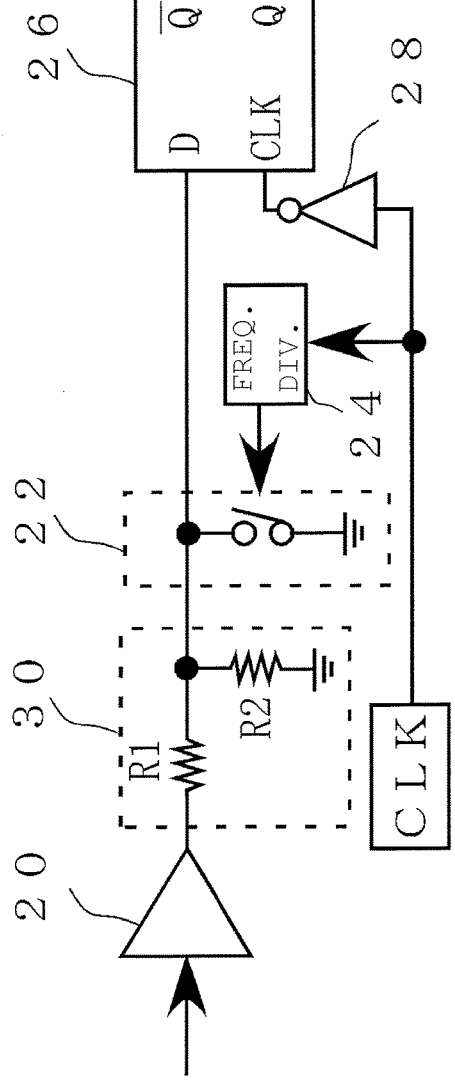
FIGS. 9A and 9B are configuration diagrams illustrating bias generating circuits according to the second embodiment.
Figure 9B:
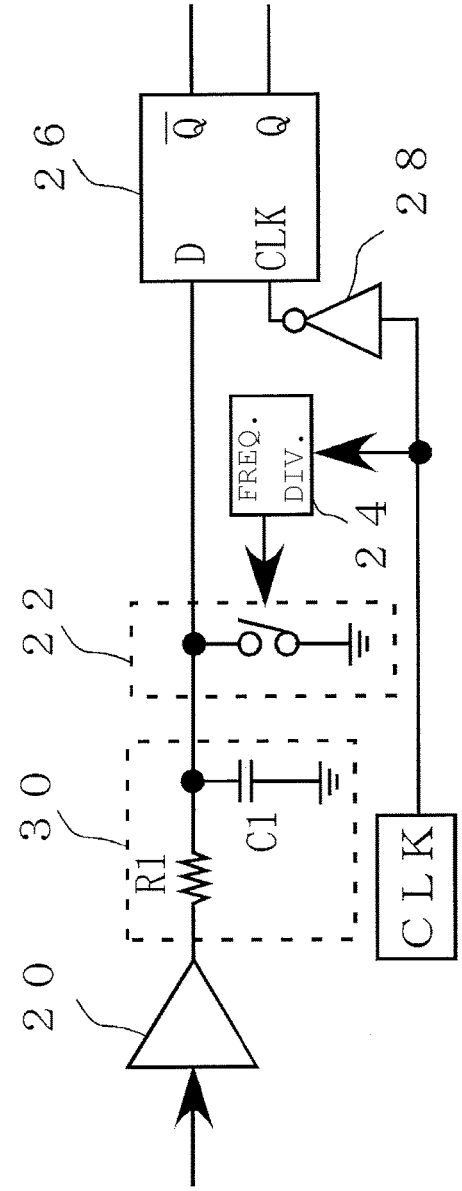

FIGS. 9A and 9B illustrate examples of the circuit configurations of the bias generating circuit 30 according to this embodiment. FIG. 9A illustrates the example in which the bias generating circuit 30 configured by resistors R1 and R2 is provided between the integrator 20 and the chopper circuit 22. FIG. 9B illustrates the example in which the bias generating circuit 30 configured by the resistor R1 and a capacitor C1 is provided between the integrator 20 and the chopper circuit 22. In FIG. 9A, a voltage level determined by the resistor R1 and the resistor R2 at the non-signal time is supplied to the D-type flip-flop 26. In FIG. 9B, a voltage level determined by the resistor R1 and the capacitor C1 at the non-signal time is supplied to the D-type flip-flop 26. Needless to say, these circuit configurations are examples, and thus other configurations may be used. The bias generating circuit 31 may have the circuit configuration similar to that of the bias generating circuit 30.

In this embodiment, the bias generating circuits 30 and 31 apply a bias voltage so as to prevent the switching from being performed at the zero level of the ternary PDM signal. However, the circuit can be configured so that when signal distortion is generated near the zero level due to non-switching, the bias level to be applied is adjusted, slight switching is allowed near the zero level, and thus the signal distortion is suppressed. The configuration in which a bias voltage is applied to a signal in order to suppress signal distortion is publicly known as described in, for example, JP 5033244 B2 and the like. In this embodiment, however, the bias generating circuits 30 and 31 are provided at the previous stage of the chopper circuits 22 and 23 on the assumption that a ternary PDM signal is generated, and thus it should be noted that this point is essentially different from the publicly-known bias application.

Further, a digital switching amplifier for generating a ternary signal of +1, 0, −1 as a switching signal when the delta sigma modulation is performed so that a PDM signal is generated is described in, for example, JP H10-233634 A and thus is publicly known. However, it should be noted that the circuit configuration in which the zero level is inserted in synchronization with the clock timing is not described, and also the quantizer is assumed to generate the ternary signal of +1, 0, and −1, and thus the ternary PDM signal is not generated by delay and quantization in the D-type flip-flops 26 and 27 unlike this embodiment.

Third Embodiment

In the second embodiment, a ternary PDM signal of +1, 0, and −1 is generated to be output, and the bias generating circuit 30 and the bias generating circuit 31 apply a bias voltage so that the switching at the non-signal time is suppressed. However, since a bias voltage is applied not only at the non-signal time but also at a signal generated time, distortion may occur.

The third embodiment, therefore, describes a circuit configuration in which the switching at the non-signal time is suppressed, and distortion at the signal generated time can be reduced.

Figure 10:
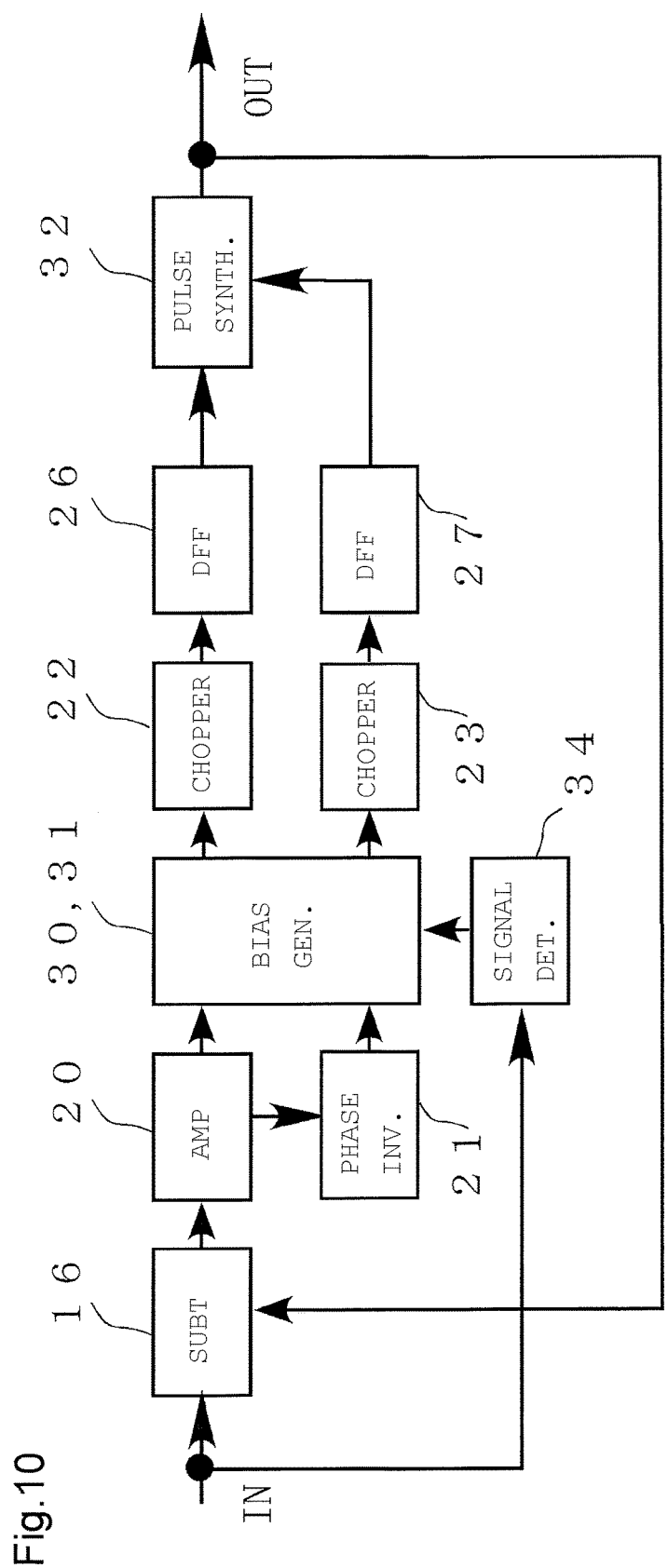
FIG. 10 is a configuration block diagram according to a third embodiment.

FIG. 10 illustrates a circuit configuration according to this embodiment. In addition to the circuit configuration shown in FIG. 6, a signal detector 34 is further provided. In FIG. 10, in view of the matching of the configuration between the bias generating circuit 30 and the bias generating circuit 31, the configuration is illustrated for both the circuits.

The signal detector 34 detects presence and absence of an input signal, and outputs a detected signal to the bias generating circuits 30 and 31. The bias generating circuits 30 and 31 control a bias voltage based on the detected signal from the signal detector 34. That is, control is made so that a comparatively large bias voltage is applied at the non-signal time at which the input signal is not detected, and a comparatively small bias voltage is applied at the signal generated time at which a pulse is detected.

Figure 11:
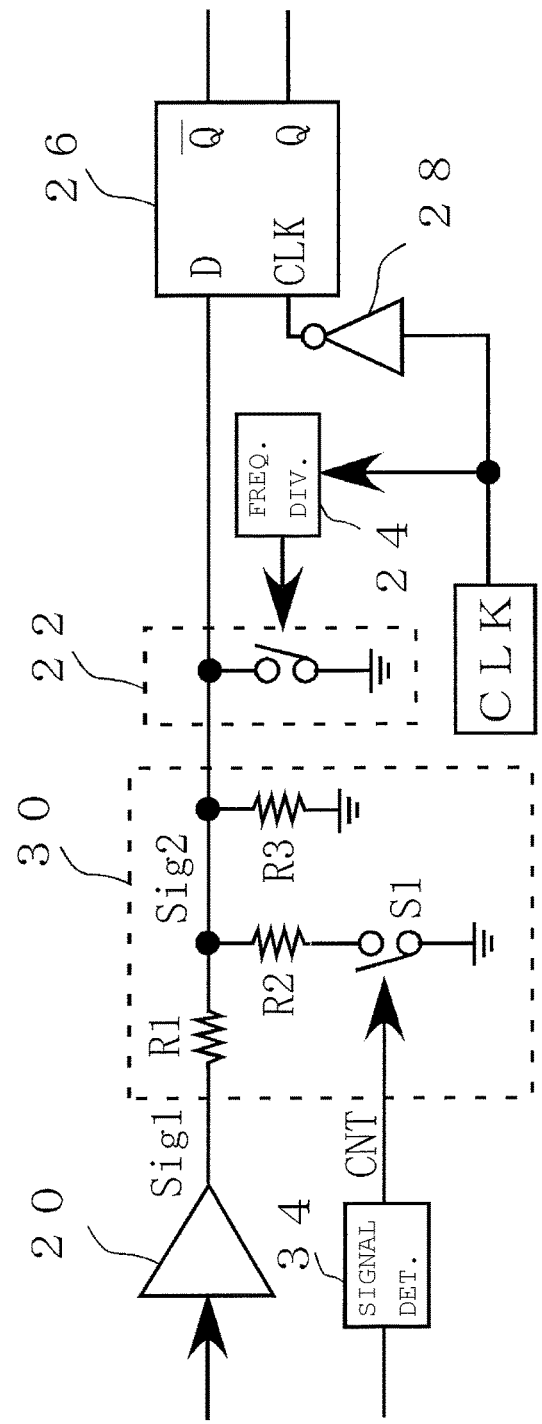
FIG. 11 is a circuit configuration diagram according to the third embodiment.

FIG. 11 illustrates an example of the circuit configuration of the bias generating circuit 30 according to this embodiment. The bias generating circuit 30 is configured by resistors R1, R2, and R3, and a switch S1. The resistor R1 is connected to an output end of the integrator 20, and one ends of the resistors R2 and R3 are connected between the resistor R1 and a chopper circuit 22. The other end of the resistor R2 is grounded via the switch S1, and the other end of the resistor R3 is grounded. The switch S1 is controlled to be on/off based on the detection signal from the signal detector 34. When the input signal is detected, the switch S1 is turned off, and when the input signal is not detected, the switch S1 is turned on. Therefore, a comparatively large bias voltage that is divided by the resistors R1, R2, and R3 is applied at the non-signal time at which the input signal is not detected, and a comparatively small bias voltage that is divided by the resistors R1 and R3 is applied at the signal generated time at which the input signal is detected.

FIGS. 12A to 12D illustrate timing charts according to this embodiment. FIG. 12A illustrates an output signal waveform of the integrator 20, and FIG. 12B illustrates an output signal waveform of the bias generating circuit 30. Further, FIG. 12C illustrates an input signal waveform, and FIG. 12D illustrates an output signal waveform of an input signal detector 34.

When an input signal is present, a detection signal of the input signal detector 34 is "0" (detection), and a small bias voltage is applied. On the other hand, when an input signal is absent and the time t continues for a predetermined length, the detection signal of the input signal detector 34 is "1" (not detected), and a large bias voltage is applied. In FIG. 12B, when the time during which an input signal is absent continues, a magnitude of the bias voltage changes as indicated by an arrow at the timing where the detection signal of the input signal detector 34 transits from "0" to "1".

In such a manner, a bias voltage is varied according to presence and absence of a signal, so that switching at the non-signal time can be suppressed, and signal distortion at time when a signal is generated can be effectively suppressed.

Fourth Embodiment

In the above embodiments, a ternary signal of +1, 0, and −1 (ternary pulse density modulation signal) is generated to be output, but in order to obtain a high output using a ternary pulse density modulation signal, it is necessary to drive a loudspeaker by a voltage VB higher than a modulator power supply Vdd. When the loudspeaker is driven in the ternary pulse density modulation signal, it is necessary to provide not only the high voltage VB but also a middle point voltage supply (VB/2) and a middle point voltage retaining circuit, and thus a circuit scale increases.

The fourth embodiment, therefore, describes a circuit configuration in which a signal optimum for a single power supply three-state loudspeaker driving circuit is generated from the ternary pulse density modulation signal.

Figure 13:
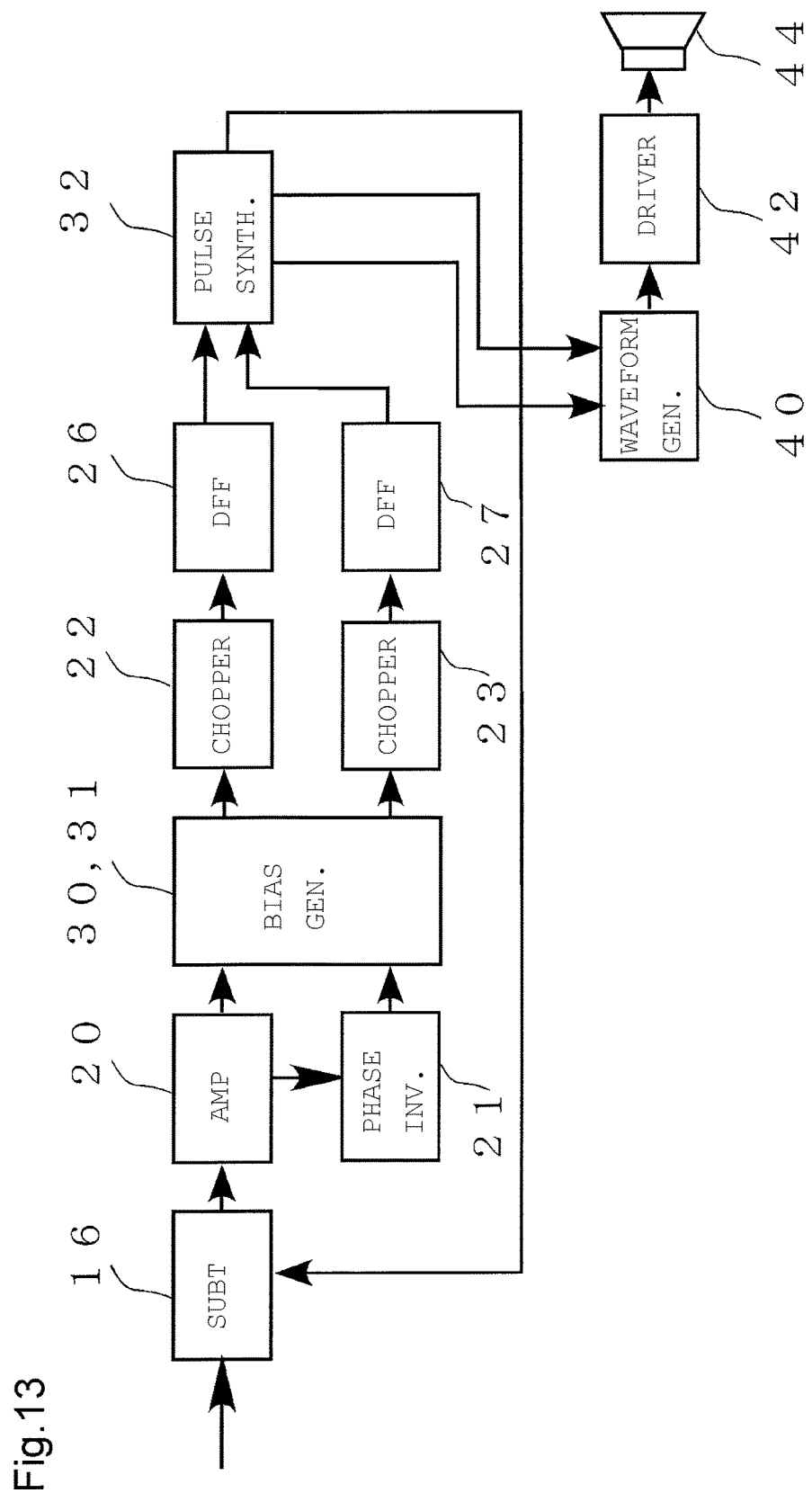
FIG. 13 is a configuration block diagram according to a fourth embodiment.

FIG. 13 illustrates the circuit configuration according to this embodiment. A basic configuration is similar to the circuit configuration shown in FIG. 6, and a single-valued ternary waveform generating circuit 40, a driver circuit 42, and a loudspeaker 44 are provided at a subsequent stage of D-type flip-flops 26 and 27 and a pulse synthesizing circuit 32.

The single-valued ternary waveform generating circuit 40 is a circuit for converting a ternary pulse density modulation signal into a single-valued ternary waveform signal in order to supply a ternary pulse density modulation signal generated by the D-type flip-flops 26 and 27 and the pulse synthesizing circuit 32 to the driver 42 which is the single power supply three-state loudspeaker driving circuit. Here, "single-valued ternary" means to realize three driving states including a state of driving with a positive current (positive on), a state of driving with a negative current (negative on), and an off-state for the loudspeaker to be driven by the single power supply. The positive current and the negative current mean that directions of electric currents flowing in the loudspeaker 44 are opposite to each other.

Figure 14:
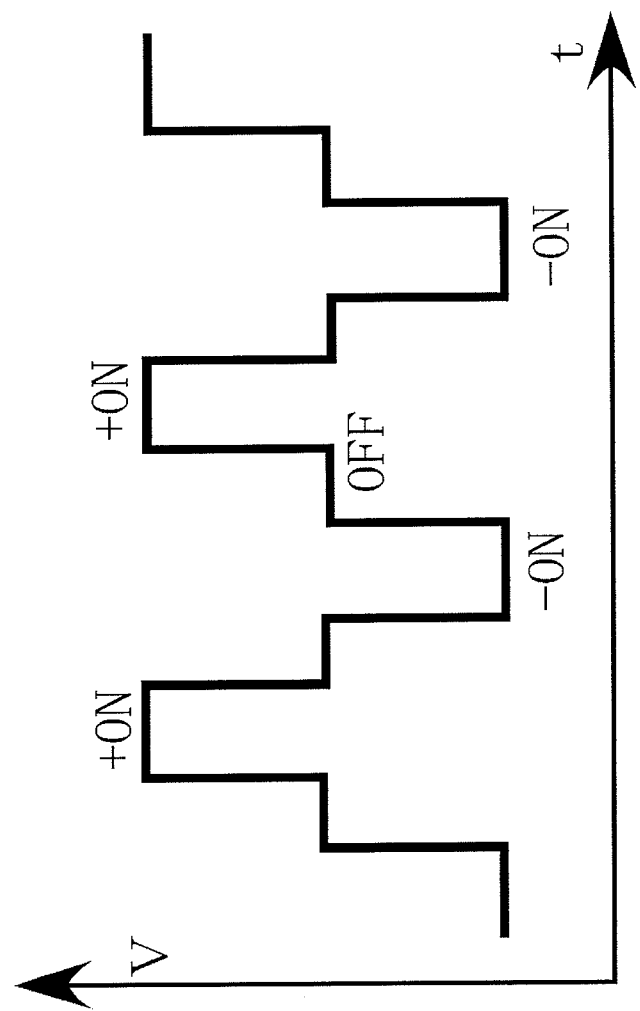
FIG. 14 is an explanatory diagram of a ternary waveform.

FIG. 14 and FIGS. 15A to 15D illustrate a principle of the driving of the loudspeaker through the single power supply. FIG. 14 illustrates a ternary waveform, and three values +1, 0, and −1 are related to the three states including a positive on-state, an off-state, and a negative on-state. FIGS. 15A to 15D illustrate conductive states of the loudspeaker 44 in these three states, and FIGS. 15A, 15B, 15C, and 15D correspond to positive on-state, negative on-state, off-state, and off-state, respectively.

In FIG. 15A, in the positive on-state, switches S11 and S14 are turned on and switches S12 and S13 are turned off in the four switches S11 to S14, and an electric current flows in the order of the power supply, the switch S11, the loudspeaker 44, and the switch S14 so that the loudspeaker 44 is driven. Further, in FIG. 15B, in the negative on-state, the switches S13 and S12 are turned on and the switches S11 and S14 are turned off in the four switches S11 to S14, and an electric current flows in the order of the power supply, the switch S13, the loudspeaker 44, and the switch S12 so that the loudspeaker 44 is driven. Further, in FIG. 15C, in the off-state, the switches S11 and S13 are turned off and the switches S12 and S14 are turned on in the four switches S11 to S14, and both ends of the loudspeaker 44 have the same electric potential. Thus, an electric current does not flow and the loudspeaker 44 is not driven. Also in FIG. 15D, in the off-state, the switches S12 and S14 are turned off and the switches S11 and S13 are turned on in the four switches S11 to S14, and both the ends of the loudspeaker 44 have the same electric potential. Thus, an electric current does not flow and the loudspeaker 44 is not driven. In FIG. 15C and FIG. 15D, since both the ends of the loudspeaker 44 have the same electric potential, an electric current does not flow and the loudspeaker 44 is not driven. Thus, this state can be said as the off-state caused by short-circuit. Needless to say, other than the above, all of the four switches S11 to S14 are turned off, so that the state where the loudspeaker 44 is not driven can be obtained.

Figure 16:
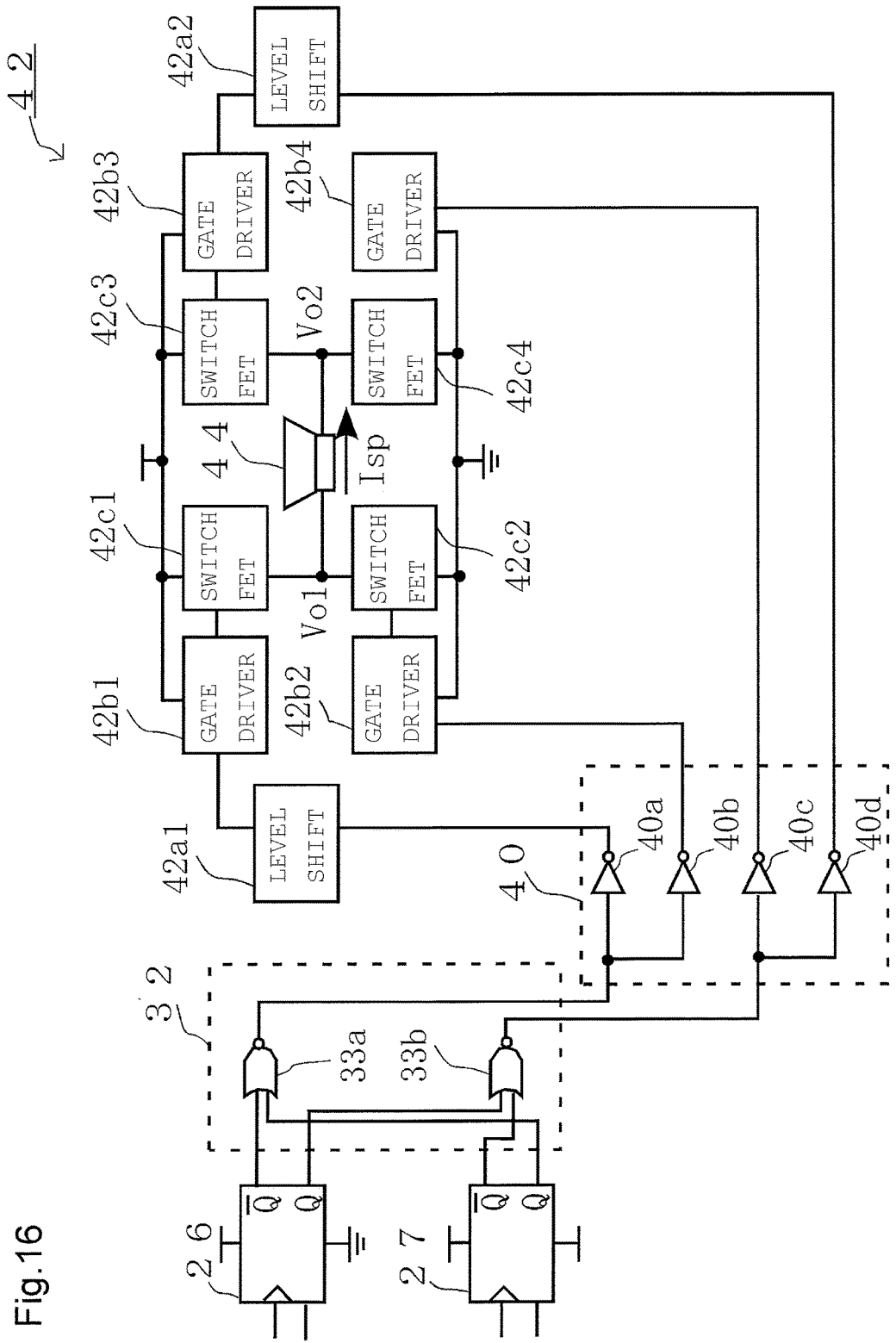
FIG. 16 is a circuit configuration diagram according to the fourth embodiment.

FIG. 16 illustrates a circuit configuration of the single-valued ternary waveform generating circuit 40. FIG. 16 also illustrates a circuit configuration of the driver 42.

The single-valued ternary waveform generating circuit 40 includes four NOT gates 40a to 40d. The NOT gates 40a to 40d are referred to as G11, G12, G13, and G14, respectively, from the top of the figure. That is, the NOT gate 40a is G11, the NOT gate 40b is G12, the NOT gate 40c is G13, and the NOT gate 40d is G14. An output signal from the NOR gate 33a constituting the pulse synthesizing circuit 32 is supplied to the gates G11 and G12, and an output signal from the NOR gate 33b constituting the pulse synthesizing circuit 32 is supplied to the gates G13 and G14. The gates G11 to G14 invert an input signal, and supply output signals to the driver 42. The NOR gate 33a performs a logic operation on a signal from an inverting output terminal (Q bar) of the D-type flip-flop 26 and a signal from an output terminal (Q) of the D-type flip-flop 27, and the NOR gate 33b performs a logic operation on a signal from an output terminal (Q) of the D-type flip-flop 26 and an signal from an inverting output terminal (Q bar) of the D-type flip-flop 27. Then, the operated signals are output.

The driver 42 includes level shift circuits 42a1 and 42a2, gate driving circuits 42b1 to 42b4, and switching FETs 42c1 to 42c4. The four switching FETs 42c1 to 42c4 correspond to the four switches S11 to S14 in FIG. 15, respectively. The switching FETs 42c1 and 42c3 are P-channel FETs, and the switching FETs 42c2 and 42c4 are N-channel FETs.

One end of the loudspeaker 44 is connected to a connection node between the switching FET 42c1 and the switching FET 42c2 connected to each other in series, and the other end is connected to a connection node between the switching FET 42c3 and the switching FET 42c4 connected to each other in series. The switching FET 42c1 and the switching FET 42c3 are connected to a positive pole side of the single power supply, and the switching FET 42c2 and the switching FET 42c4 are connected to a negative pole side of the single power supply. Therefore, when the switching FET 42c1 is turned on, the switching FET 42c2 is turned off, the switching FET 42c3 is turned off, and the switching FET 42c4 is turned on, an electric current flows in the order of the switching FET 42c1, the loudspeaker 44, and the switching FET 42c4, so that a positive current on-state is obtained. Further, when the switching FET 42c1 is turned off and the switching FET 42c2 is turned on, and when the switching FET 42c3 is turned on and the switching FET 42c4 is turned off, an electric current flows in the order of the switching FET 42c3, the loudspeaker 44, and the switching FET 42c2, so that a negative current on-state is obtained. Further, when the switching FETs 42c1 and 42c3 are turned off, the switching FETs 42c2 and 42c4 are turned on, an electric current does not flow in the loudspeaker 44 so that the off-state is obtained.

Output signals from the four logic gates G11 to G14 of the single-valued ternary waveform generating circuit 40 are supplied to the gate driving circuits 42b1 to 42b4 in order to drive the four switching FETs 42c1 to 42c4, respectively. That is, the output signal from the gate G11 is supplied to the gate driving circuit 42b1 via the level shift circuit 42a1, so as to drive the switching FET 42c1. The output signal from the gate G12 is supplied to the gate driving circuit 42b2 so as to drive the switching FET 42c2. The output signal from the gate G14 is supplied to the gate driving circuit 42b3 via the level shift circuit 42a2 so as to drive the switching FET 42c3. The output signal from the gate G13 is supplied to the gate driving circuit 42b4 so as to drive the switching FET 42c4.

When the outputs from the NOR gates 33b and 33a are "1" and "0", respectively, the outputs from the gates G11 and G12 are "0" obtained by inverting "1", and the outputs from the gates G13 and G14 are "1" obtained by inverting "0". As a result, the switching FET 42c1 is turned on, the switching FET 42c2 is turned off, the switching FET 42c3 is turned off, and the switching FET 42c4 is turned on, and an electric current flows in the order of the switching FET 42c1, the loudspeaker 44, and the switching FET 42c4 (+ON state).

When the outputs from the NOR gates 33b and 33a are "0" and "1", respectively, the outputs from the gates G11 and G12 are "1" obtained by inverting "0", and the outputs from the gates G13 and G14 are "0" obtained by inverting "1". As a result, the switching FET 42c1 is turned off, the switching FET 42c2 is turned on, the switching FET 42c3 is turned on, and the switching FET 42c4 is turned off, and an electric current flows in the order of the switching FET 42c3, the loudspeaker 44, and the switching FET 42c2 (−ON state).

When the outputs from the NOR gates 33b and 33a are "1", the outputs from the gates G11 to G14 are "0" obtained by inverting "1". As a result, the switching FET 42c1 is turned on, the switching FET 42c2 is turned off, the switching FET 42c3 is turned on, and the switching FET 42c4 is turned off, so that an electric current does not flow in the loudspeaker 44 (OFF state).

Further, when the outputs from the NOR gates 33b and 33a are "0", the outputs from the gates G11 to G14 are "1" obtained by inverting "0". As a result, the switching FET 42c1 is turned off, the switching FET 42c2 is turned on, the switching FET 42c3 is turned off, and the switching FET c4 is turned on, so that an electric current does not flow in the loudspeaker 44 (OFF state).

As described above, the single-valued ternary waveform generating circuit 40 generates a signal for driving the single power supply three-state loudspeaker based on a ternary pulse density modulation signal, so that the loudspeaker 44 can be driven without increasing the circuit scale.

The configuration in which the loudspeaker connected to the single power supply is driven in the three states, i.e., the positive state, the negative state, and the off-state is described in JP H6-504658 W and is publicly known. This configuration is based on a PWM signal but is not based on a PDM signal unlike this embodiment. Therefore, it should be noted that the generating circuit 40 for generating a single-valued ternary signal using a PDM signal from the D-type flip-flops 26 and 27 is not disclosed, and needless to say, the combinations of the four logic gates for performing the logic operation on the four output signals from the D-type flip-flops 26 and 27 are not disclosed.

In this embodiment, the chopper circuits 22 and 23 insert the zero level at the timing synchronized with a clock signal, but the zero level can be inserted in the D-type flip-flops (DFFs) 26 and 27 without using the chopper circuits 22 and 23, and delay and quantization can be performed.

Figure 18:
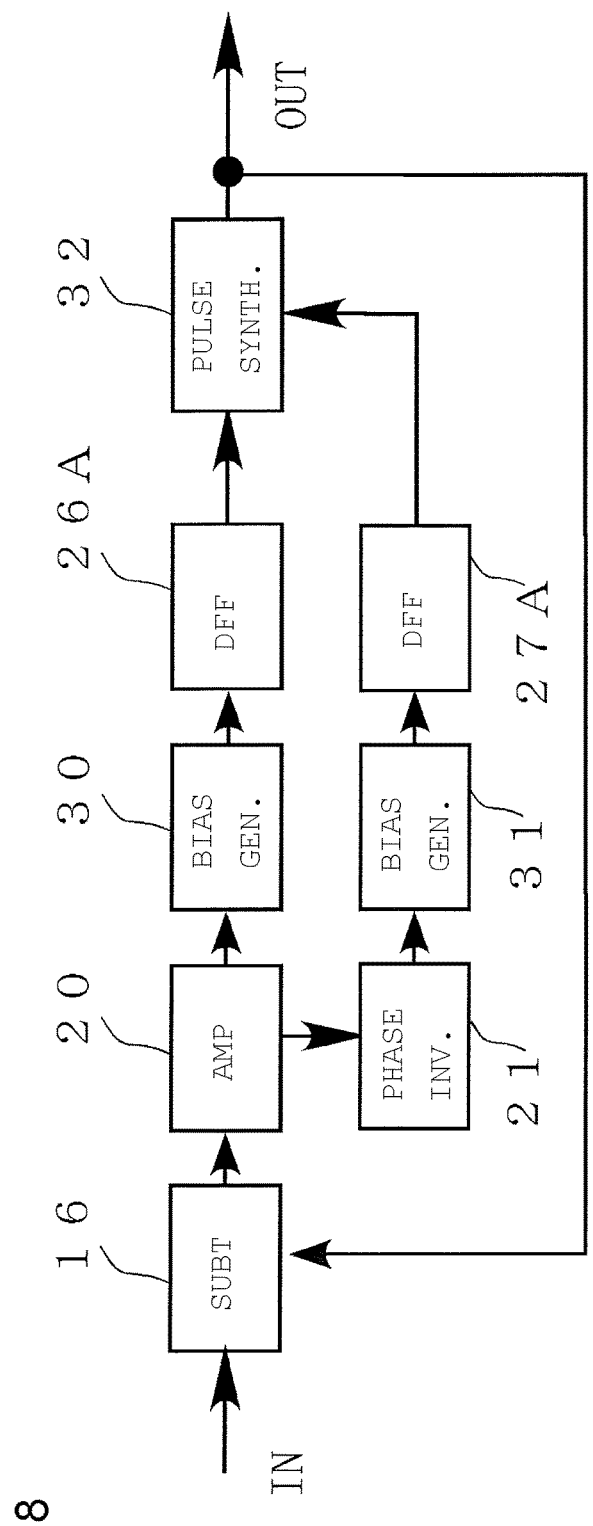
FIG. 18 is a circuit configuration diagram according to still another embodiment.

FIG. 18 illustrates a circuit configuration in this case. The circuit configuration in FIG. 18 is basically similar to that shown in FIG. 6, but it does not include the chopper circuits 22 and 23, and includes DFFs 26A and 27A instead of the DFFs 26 and 27. The DFFs 26A and 27A further have reset terminals in addition to the configuration of the DFFs 26 and 27, and when a signal is supplied to the reset terminals, reset, that is, the zero level is output. As shown in FIG. 2, in this embodiment, a clock signal CLK is supplied to a clock terminal of the DFF 26 (and DFF 27) via the inverter 28, but this clock signal is simultaneously supplied to the reset terminals of the DFFs 26A and 27A. Therefore, the DFFs 26A and 27A insert a zero level in synchronization with a clock signal and simultaneously delay the signals from the bias generating circuits 30 and 31 so as to output the delayed signals as one-bit digital signals. Similarly to the case of the circuit configuration in FIG. 6, the pulse synthesizing circuit 32 synthesizes the one-bit digital signal from the DFF 26A with a one-bit digital signal from the DFF 27A so as to output a synthesized signal.

What is claimed is:

1. A signal modulation circuit for performing delta sigma modulation on an input signal in synchronization with a clock signal to output the modulated signal, the circuit comprising:
    a subtractor for calculating a difference between the input signal and a feedback signal;
    an integrator for integrating an output signal from the subtractor;
    a zero level inserting circuit for inserting a zero level into the signal integrated by the integrator at timing synchronized with the clock signal;
    a quantizer for delaying the signal output from the zero level inserting circuit and quantizing the delayed signal; and
    a feedback circuit for feeding back the signal quantized by the quantizer to the input signal.

2. The signal modulation circuit according to claim 1, wherein
    the zero level inserting circuit includes
    a frequency divider for dividing a frequency of the clock signal, and
    a chopper circuit that operates according to the clock signal whose frequency is divided by the frequency divider.

3. The signal modulation circuit according to claim 1, wherein
    the quantizer is configured by a D-type flip-flop.

4. The signal modulation circuit according to claim 1, wherein the zero level inserting circuit and the quantizer are configured by a D-type flip-flop, and the clock signal is supplied to a reset terminal of the D-type flip-flop.

\* \* \* \* \*